United States Patent
Quevedo-Lopez et al.

(10) Patent No.: US 7,625,807 B2
(45) Date of Patent: Dec. 1, 2009

(54) METHODS AND SYSTEMS TO MITIGATE ETCH STOP CLIPPING FOR SHALLOW TRENCH ISOLATION FABRICATION

(75) Inventors: Manuel A. Quevedo-Lopez, Richardson, TX (US); James J. Chambers, Dallas, TX (US); Leif Christian Olsen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 158 days.

(21) Appl. No.: 11/678,107

(22) Filed: Feb. 23, 2007

(65) Prior Publication Data

US 2007/0134886 A1 Jun. 14, 2007

Related U.S. Application Data

(62) Division of application No. 10/874,038, filed on Jun. 22, 2004, now Pat. No. 7,199,021.

(51) Int. Cl.
 *H01L 21/76* (2006.01)
 *H01L 21/336* (2006.01)

(52) U.S. Cl. ............ 438/425; 438/435; 438/294; 438/295; 438/296

(58) Field of Classification Search ............. 438/425, 438/435, 294, 295, 296
See application file for complete search history.

(56) References Cited

U.S. PATENT DOCUMENTS

| 5,741,740 A * | 4/1998 | Jang et al. ............ 438/435 |
|---|---|---|
| 5,989,978 A | 11/1999 | Peidous |
| 6,180,492 B1 | 1/2001 | Shih et al. |
| 6,191,004 B1 | 2/2001 | Hsiao |
| 6,323,106 B1 | 11/2001 | Huang et al. |
| 6,326,282 B1 | 12/2001 | Park et al. |
| 6,468,853 B1 | 10/2002 | Balasubramanian et al. |
| 6,656,852 B2 | 12/2003 | Rotondaro et al. |
| 6,660,613 B2 | 12/2003 | Kim et al. |
| 6,664,195 B2 | 12/2003 | Jang et al. |
| 6,667,246 B2 | 12/2003 | Mitsuhashi et al. |
| 6,734,082 B2 | 5/2004 | Zheng et al. |
| 6,881,645 B2 | 4/2005 | Ahn et al. |
| 6,958,513 B2 | 10/2005 | Wang |
| 7,012,027 B2 | 3/2006 | Perng et al. |
| 7,022,583 B1 | 4/2006 | Leng et al. |
| 7,026,714 B2 * | 4/2006 | Cunningham ............ 257/751 |
| 7,029,987 B2 | 4/2006 | Kim |

* cited by examiner

*Primary Examiner*—Luan C Thai
(74) *Attorney, Agent, or Firm*—Wade J. Brady, III; Frederick J. Telecky, Jr.

(57) ABSTRACT

The present invention facilitates semiconductor fabrication by maintaining shape and density of an etch stop layer (206) during trench fill operations. The shape and density of the etch stop layer (206) is maintained by forming a protective alloy liner layer (310) on the etch stop layer (206) prior to trench fill operations. The protective alloy liner (310) is comprised of an alloy that is resistant to materials employed in the trench fill operations. As a result, clipping and/or damage to the etch stop layer (206) is mitigated thereby facilitating a subsequent planarization process that employs the etch stop layer (206). Additionally, selection of thickness and composition (1706) of the formed protective alloy (310) yields a stress amount and type (1704) that is applied to channel regions of unformed transistor devices, ultimately providing for an improvement in channel mobility.

7 Claims, 8 Drawing Sheets

METHODS AND SYSTEMS TO MITIGATE ETCH STOP CLIPPING FOR SHALLOW TRENCH ISOLATION FABRICATION

This application is a divisional of U.S. patent application Ser. No. 10/874,038, filed Jun. 22, 2004 and issued Apr. 3, 2007 as U.S. Pat. No. 7,199,021.

FIELD OF THE INVENTION

The present invention relates generally to semiconductor device fabrication, and more particularly, systems and methods for mitigating etch stop layer clipping during trench fill while and to selectively controlling generation of stress across channel regions.

BACKGROUND OF THE INVENTION

Semiconductor device fabrication involves using a number of fabrication processes to build a desired device. Generally, a semiconductor device is fabricated on a semiconductor material referred to as a substrate by forming layers or components, selectively patterning formed layers, and selectively implanting dopants into layers and/or the substrate in order to achieve desired operational characteristics.

A common structure that is fabricated in semiconductor devices is a shallow trench isolation (STI) region formed in a substrate. The STI region serves to electrically isolate multiple active devices (e.g., transistors) so that they do not interfere with each others' operations. Generally, an STI region is formed in/on a device by selectively etching a shallow trench between components or devices, filling the shallow trench with oxide, and then planarizing the device to substantially remove portions of the fill oxide from a surface of the device while leaving the fill oxide within the etched shallow trench.

Typically, formation of STI regions employs forming an etch stop layer prior to etching the shallow trenches. The etch stop layer is selectively formed (deposited and patterned) in non-trench regions and is comprised of a material, such as nitride, that is substantially resistant to a planarization process being employed. A trench oxide fill process is then performed that deposits oxide into the shallow trenches. During the fill process, clipping and/or damage to the etch stop layer can occur. For relatively larger devices, this clipping and/or damage of the etch stop layer may not be a problem. However, as semiconductor device sizes continue to decrease, so does the size and/or amount of etch stop material. If plasma based processes are used to fill the trench, then is necessary to increase the plasma power to be able to completely fill the trench. This increase in power produces an increase in etch stop layer clipping. If a minimal amount of etch stop material is not present, the CMP planarization process can damage underlying regions and the filled trenches.

What is needed are systems and methods that mitigate clipping and/or damage to etch stop layers and facilitate shallow trench isolation region fabrication.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by maintaining shape and density of an etch stop layer during trench fill operations. The shape and density of the etch stop layer is maintained by forming a protective alloy liner layer on the etch stop layer prior to trench fill operations. The protective alloy liner is comprised of an alloy that is resistant to materials employed in the trench fill operations. As a result, clipping and/or damage to the etch stop layer is mitigated thereby facilitating a subsequent planarization process that employs the etch stop layer. Additionally, selection of thickness and composition of the formed protective alloy yields a stress amount and type that is applied to channel regions of unformed transistor devices, ultimately providing for an improvement in channel mobility.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Shallow trench isolation (STI) regions are formed in/on devices by selectively etching a shallow trench between components or devices, filling the shallow trench with oxide, and then planarizing the device to substantially remove portions of the fill oxide from a surface of the device while leaving the fill oxide within the etched shallow trench. An etch stop layer is formed prior to etching the shallow trench in order to facilitate the planarization process, which is performed after the trench fill and is used to limit oxide removal. Conventionally, the etch stop layer can be damaged/clipped during the trench fill procedure. As a result, the subsequent planarization can be performed improperly resulting in damage to underlying component and the STI regions. Some previous solutions to minimize clipping have been proposed and include alternate fill techniques such as spin on dielectric and chemical vapor deposition based processes, but these solutions do not yield an adequate trench fill. Additionally, a SiC mask has also been tried, but the resulting SiC layer is difficult to remove after a fill operation.

The present invention facilitates semiconductor device fabrication by mitigating clipping and/or damage to an etch stop layer during trench filling procedures and thereby maintaining density of the etch stop layer (e.g., 25 percent may be sufficient). The clipping and/or damage is mitigated by formation of a protective alloy liner layer that protects the etch stop layer prior to performing trench filling procedures. Shallow trench isolation regions can then be filled and planarized while mitigating damage to the device due to the integrity of the etch stop layer. As a result, semiconductor devices can be fabricated at tighter dimensions than could be otherwise.

Figure 1:
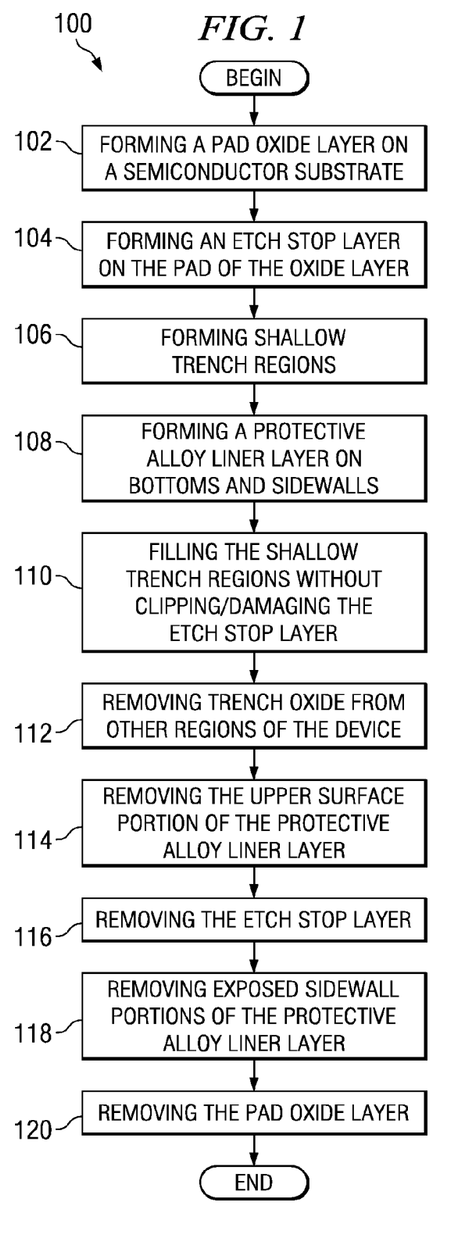
FIG. 1 is a flow diagram illustrating a method 100 of fabricating a semiconductor device that mitigates damage to an etch stop layer during fabrication.

FIG. 1 is a flow diagram illustrating a method 100 of fabricating a semiconductor device that mitigates damage to an etch stop layer during fabrication. The method 100 deposits a protective liner layer prior to trench filling that mitigates damage to an etch stop layer. The method 100 is described in conjunction with FIGS. 2-9, which serve to illustrate an exemplary structure of a semiconductor device fabricated by the method 100 at various stages of fabrication.

The method 100 begins at block 102 wherein a pad oxide layer is formed on a semiconductor substrate. The pad oxide layer is typically grown to a suitable thickness by a thermal oxide growth process when the semiconductor substrate is comprised of silicon. Subsequently, an etch stop layer is formed on the pad oxide layer at block 104. The etch stop layer is employed later to facilitate planarization after trench filling.

The etch stop layer is comprised of a suitable etch stop material, such as silicon nitride. A number of suitable deposition techniques can be employed to deposit silicon nitride. One technique is to deposit a layer of silicon on the pad oxide and then perform thermal nitridation (e.g., with ammonia, NH3), which causes the silicon to react with ammonia thereby forming silicon-nitride. However, this technique typically requires relatively high temperatures and has a slow growth rate. Another technique is to employ a low pressure chemical vapor deposition process at an intermediate temperature (e.g., about 700 to 800 degrees Celsius) wherein dichlorosilane and ammonia react at reduced pressure to deposit silicon nitride. Yet another technique is to deposit the silicon nitride with a low pressure plasma assisted chemical vapor deposition process, wherein silicon nitride is formed by reacting silane and ammonia in an argon plasma or by reacting silane in a nitrogen discharge. It is appreciated that other suitable deposition techniques can be employed in accordance with the present invention.

Continuing on, shallow trench regions are formed at block 106 by selectively etching through the etch stop layer, the pad oxide layer, and portions of the semiconductor substrate. A number of suitable etch processes can be employed including reactive ion etching, high density plasma etching, and the like. A suitable high density plasma etch process is performed at a relatively low frequency. This process works particularly well for narrow trench regions.

Figure 2:
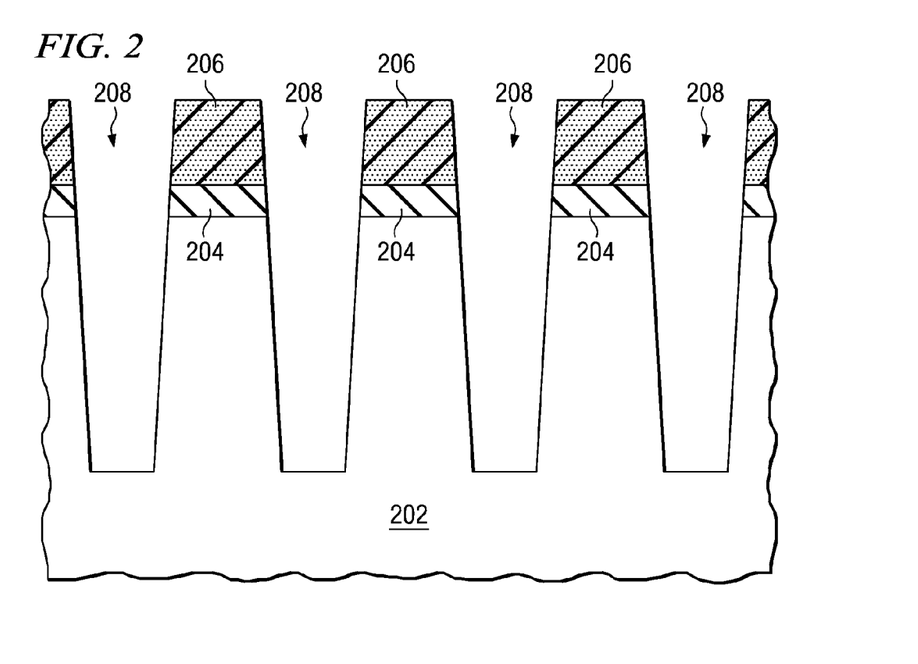
FIG. 2 is a cross sectional view of an exemplary semiconductor device at a stage of fabrication in accordance with an aspect of the present invention.

FIG. 2 is a cross sectional view of an exemplary semiconductor device at a stage of fabrication in accordance with an aspect of the present invention. FIG. 2 depicts the device after trench formation with a pad oxide layer 204 formed on a semiconductor substrate 202 and an etch stop layer 206 formed on the pad oxide layer 204. Shallow trench regions 208 are shown formed in the substrate 202.

Continuing with the method 100, a protective alloy liner layer is formed on bottom and sidewall portions of the trench regions and along upper surface portions of the etch stop layer. The protective alloy liner layer is comprised of a material resistant to trench filling operations that mitigates damage to the etch stop layer. A suitable composition for the protective alloy liner layer is a pseudo binary alloy with material according to $(AO_2)_x(BO_2)_{1-x}$, wherein A is an element selected from groups III, IV, V, VI, and VII and B is an element selected from groups III, IV, V, and VI. In one example, if A=Hf and B=Si, then a $(HfO_2)_x(SiO_2)_{1-x}$ is formed. As another example, if B=Si, a group IV material that reacts with silicon (e.g., Hf, Zr, La, and the like) can be suitable. Some examples of suitable pseudo binary alloys wherein B=Si include ZrSiO, LaSiO, YSiO, TaSiO, NbSiO, and the like. Some additional examples of suitable pseudo binary alloys include ZrTiO, HfTiO, ZrHfO, ZrGeO, HfGeO, AlTaO, and the like. The value for x is selected and within a range from 0 to 1. It is appreciated that an oxide liner layer can optionally be deposited prior to forming the protective alloy liner layer.

The protective alloy liner layer is formed over the device and in the shallow trench regions by depositing the pseudo binary alloy materially over the device by a suitable deposition process such as, for example, chemical vapor deposition (CVD), atomic layer deposition (ALD), and physical vapor deposition (PVD). CVD occurs in a reaction chamber and employs chemical precursors with the pseudo binary alloy component that reacts and, thereby, depositing the pseudo binary alloy on the selected regions of the device. By-products of the reaction are removed from the reaction chamber. Physical vapor deposition of the pseudo binary alloy is performed by evaporating a source material containing the desired composition by heating the material above its melting point in an vacuum chamber, or by ion bombarding the solid with high energy ions (sputtering). The evaporated/sputtered atoms then travel at high velocity and deposit on the device. Physical vapor deposition is advantageous in that it reduces the amount of alloy material deposited on sidewalls of the trenches. Atomic layer deposition is a surface controlled layer-by-layer deposition process for the deposition of a number of thin films with atomic layer accuracy. Each deposited film formed in a sequential process is a result of saturated surface controlled chemical reactions. Atomic layer deposition is highly controlled and conformal.

The composition as well as the thermal budget of the protective alloy liner is selected to improve etch resistance while keeping its dielectric constant value (k) as low as possible. The thickness of the deposited alloy liner is selected according to desired protection and desired applied stress by the protective alloy liner layer (described infra). Generally, a thicker liner provides more protection against subsequent damage to the etch stop layer. Protection can also be enhanced by increasing the concentration of A in the alloy.

Figure 3:
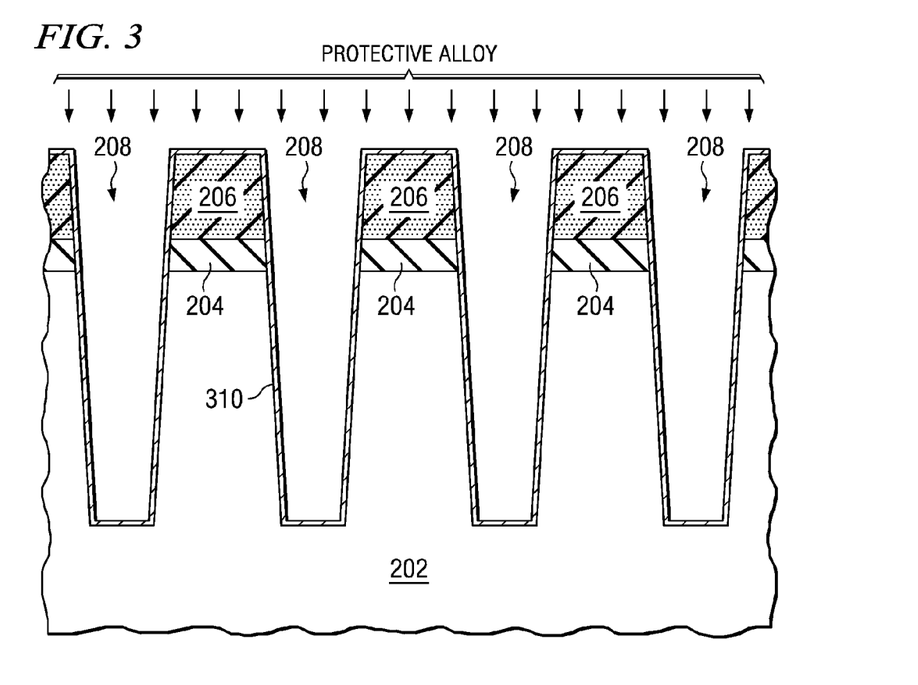
FIG. 3 is another cross sectional view of an exemplary semiconductor device at another stage of fabrication in accordance with an aspect of the invention.

FIG. 3 is another cross sectional view of an exemplary semiconductor device at another stage of fabrication in accordance with an aspect of the invention. FIG. 3 depicts the device after formation of a protective alloy liner layer 310, which can be seen formed on sidewalls of the shallow trench regions 208 and on an upper surface of the etch stop layer 206. Some exemplary thicknesses for the protective alloy liner layer 310 are about 150 Angstroms or less, exemplary thicknesses for the shallow trench regions 208 are about 100 nm to 90 nm wide and about 1000 nm deep, the etch stop layer 206 is about 500 to about 3000 Angstroms thick, and the pad oxide 204 is about 50 to 150 Angstroms. Other dimensions, however, may be employed and are contemplated by the present invention.

At block 110, the shallow trench regions are filled with trench oxide without substantially damaging and/or clipping the etch stop layer. A suitable deposition process is employed that fills in the trench regions from the bottom up. A high power/frequency high density plasma (HDP) process can be employed to deposit the trench oxide. Conventionally, the high power process could increase damage/clipping to the etch stop layer thereby prohibiting its use. However, the presence of the protective alloy liner layer mitigates negative effects of the high power plasma process on the etch stop layer and permits its use. Hydrogen can be added to the reactant gases employed in the plasma deposition process to improve gap filling by impeding sidewall deposition. The addition of hydrogen could result in clipping/damage to the etch stop layer, however the presence of the protective alloy liner layer mitigates the negative affects.

Figure 4:
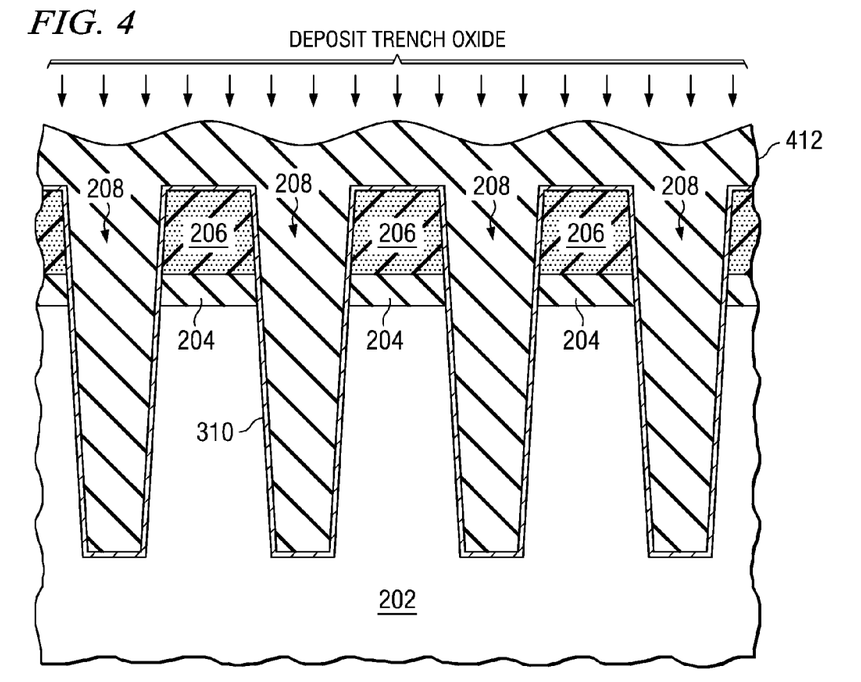
FIG. 4 is a cross sectional view illustrating an exemplary semiconductor device after a trench fill operation in accordance with an aspect of the present invention.

FIG. 4 is a cross sectional view illustrating an exemplary semiconductor device after a trench fill operation in accordance with an aspect of the present invention. Trench oxide 412 is shown deposited in the shallow trench regions 208 and on the protective alloy liner layer 310. The presence of the protective alloy liner layer 310 and the employment of the high power/frequency high density plasma fill process results in filled trenches that are substantially free from gaps and/or defects that can be obtained by utilizing lower power plasma fill processes. Additionally, area density of the etch stop layer 206 is maintained.

Subsequent to filling the trenches at block 110, portions of the deposited trench oxide are removed from exposed portions (non trench) of the device by performing a planarization process that utilizes the etch stop layer at block 112 of FIG. 1. Typically, a chemical mechanical planarization process is employed. This process employs a spinning pad and a slurry to planarize a surface of the device. The slurry contains a chemical agent and physical particles that chemically and physically remove material from the surface of the device. The etch stop layer is comprised of a material that is resistant to the chemical and physical removal of the process and limits the amount of surface material removed from the device. The protective alloy liner layer is also resistant to the chemical and physical removal by the chemical mechanical planarization.

Figure 5:
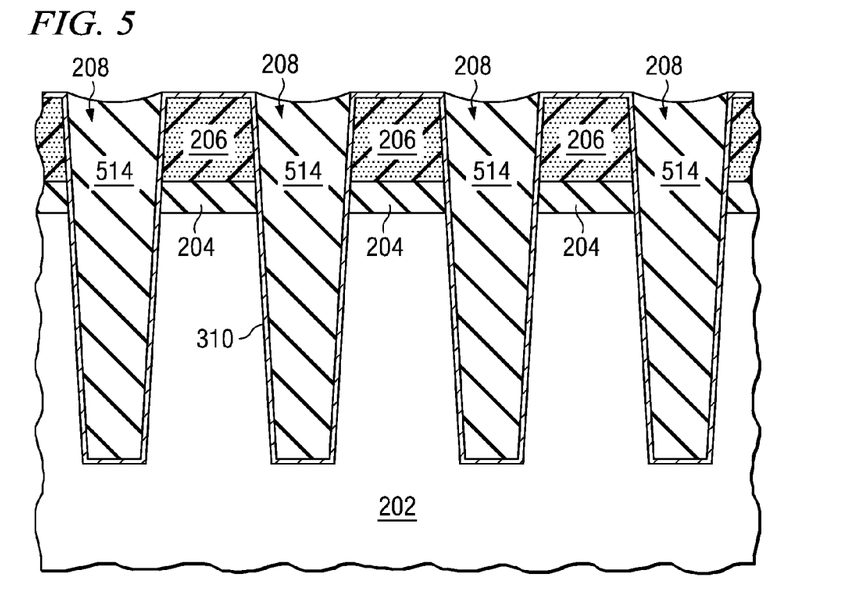
FIG. 5 is a cross sectional view illustrating an exemplary semiconductor device subsequent to planarization in accordance with an aspect of the present invention.

FIG. 5 is a cross sectional view illustrating an exemplary semiconductor device subsequent to planarization in accordance with an aspect of the present invention. It can be seen looking at FIGS. 4 and 5, that trench oxide above the etch stop layer 206 has been substantially removed leaving filled oxide trenches 514 by the planarization performed at block 112. The filled trenches, referred to as shallow trench isolation regions 514 may be slightly concave at an upper surface due dishing associated with the planarization process.

Continuing with the method 100 at block 114, an upper surface portion of the protective alloy liner layer is removed. Typically, the upper surface portion is nitrided or otherwise modified to facilitate removal by reducing its resistance to etching prior to its removal. Then, an etch process, generally a wet etch, is employed to remove the upper surface portion. The upper surface portion of the liner can be nitrided by a thermal nitridation process, a low pressure chemical vapor deposition process, or a low temperature plasma assisted nitridation process. The thermal nitridation process involves exposing the upper surface portion to ammonia at a relatively high temperature (e.g., about 700 to 100 degrees Celsius). The low pressure chemical vapor deposition process is performed at an intermediate temperature (e.g. 750 degrees Celsius) by causing the upper surface portion to react with ammonia. Additionally, the plasma assisted nitridation process is performed at an even lower temperature (e.g., about 300 degrees Celsius) and forms silicon nitride by reacting the upper surface with a nitrogen based discharge.

Figure 6:
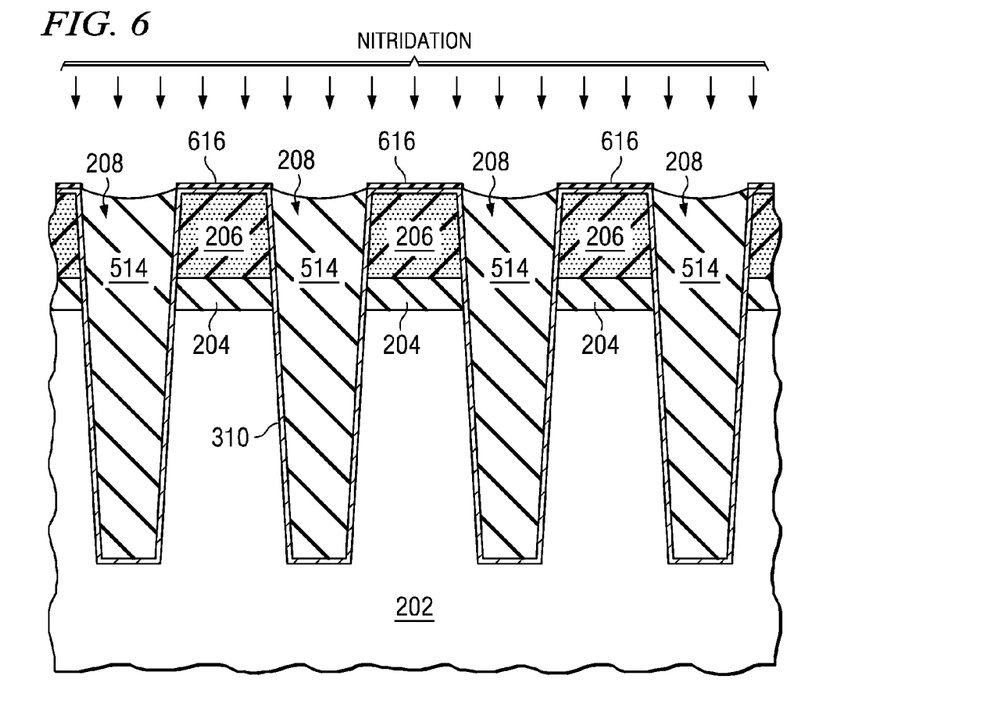
FIG. 6 is a cross sectional view illustrating an exemplary semiconductor device after nitridation of the upper surface portion 616 of the protective alloy liner layer 310 in accordance with an aspect of the present invention.

FIG. 6 is a cross sectional view illustrating an exemplary semiconductor device after nitriding an upper surface portion 616 of the protective alloy liner layer 310 in accordance with an aspect of the present invention. The upper surface portion 616 of the liner is nitrided or otherwise modified as described above to facilitate removal thereof.

The etch stop layer is removed by a suitable etch process at block 116. The etch stop layer and the upper surface portion (after being nitrided) may be removed during the same etch process. Typically a wet etch process is employed that is selective to the etch stop layer (e.g., selective to nitride), followed by a second etch to remove the exposed nitride.

Figure 7:
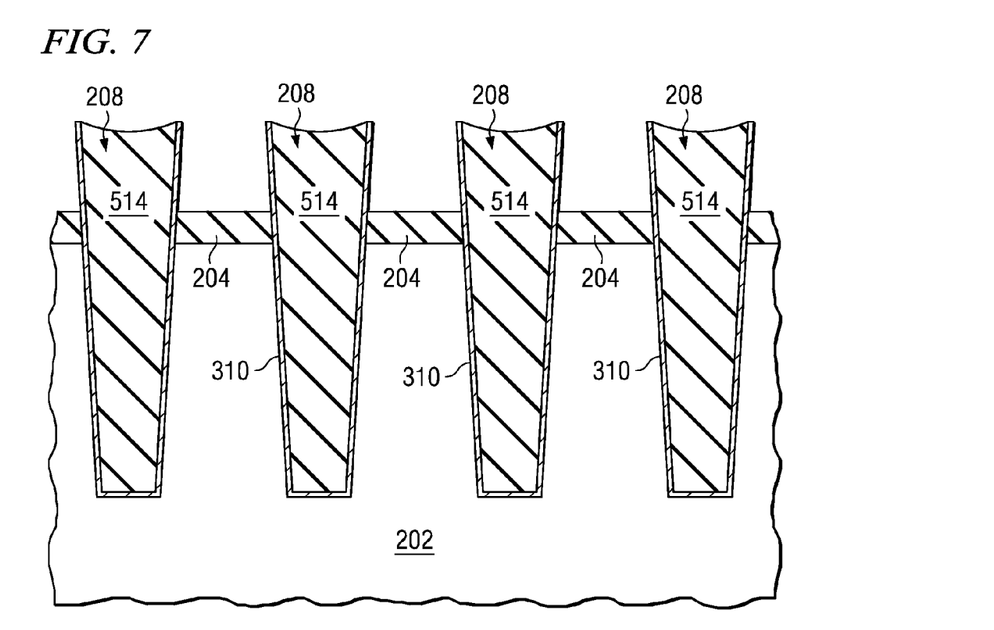
FIG. 7 is a cross sectional view illustrating an exemplary semiconductor device after removal of the etch stop layer 206 in accordance with an aspect of the present invention.

FIG. 7 is a cross sectional view illustrating an exemplary semiconductor device after removal of the etch stop layer 206 in accordance with an aspect of the present invention. The etch stop layer 206 as well as the upper surface portion 616 of the protective alloy liner layer 310 are no longer present. In FIG. 7, the shallow trench isolation regions 514 have exposed portions that extend a bit above the pad oxide layer 204, by an amount generally corresponding to a thickness of the etch stop layer.

At block 118 of FIG. 1, exposed sidewall portions of the protective alloy liner layer are selectively removed. A number of suitable selective etching techniques can be employed, including a spin etching process, a plasma assisted wet etch process, and a selective wet etch process. Additional details of these techniques are provided below.

The etch rate for the exposed sidewall portions could be higher because of its encountering plasma during the trench fill operation performed at block 110. Additionally, the etch rate is higher if the exposed sidewall portions have not been annealed because annealing significantly reduces its etch rate. It is also noted that the etch rate of the exposed sidewall portions is related to its composition. If so desired, the composition could be selected to facilitate its later etching at this block 118 of the method 100.

Figure 8:
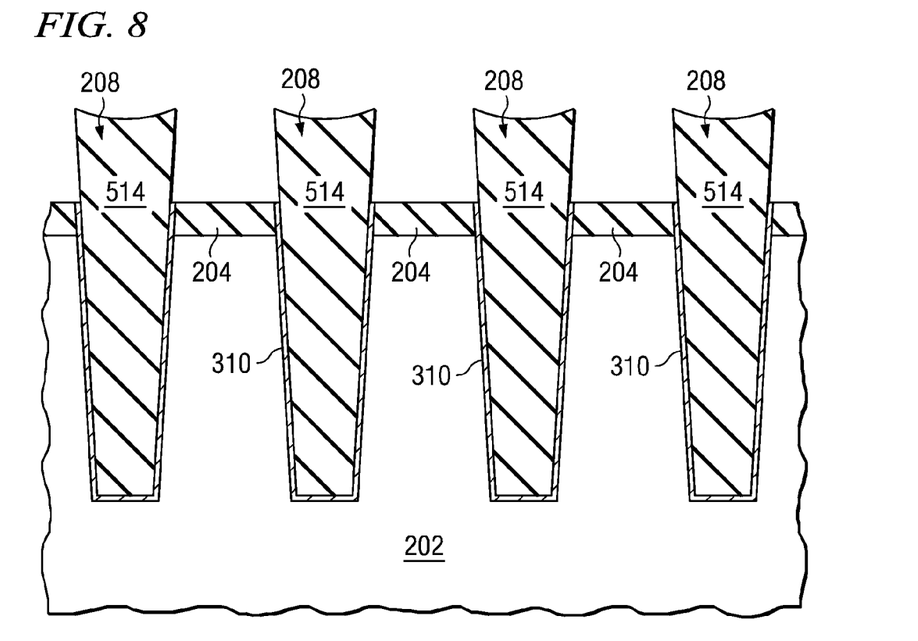
FIG. 8 is a cross sectional view illustrating an exemplary semiconductor device subsequent to removal of the exposed sidewall portions of the protective alloy liner layer 310 in accordance with an aspect of the present invention.

FIG. 8 is a cross sectional view illustrating an exemplary semiconductor device subsequent to removal of the exposed sidewall portions of the protective alloy liner layer 310 in accordance with an aspect of the present invention. It can be seen that the exposed portions are no longer present. Further details regarding removal of the exposed portions are provided infra.

The method 100 continues at block 120 wherein the pad oxide layer is removed thereby exposing the underlying semiconductor substrate. A suitable wet or dry etch process can be employed to remove the pad oxide layer. The pad oxide 204 and the shallow trench isolation regions are comprised of oxide. As a result, the removal of the pad oxide 204 removes an upper portion of the shallow trench isolation regions 514.

Figure 9:
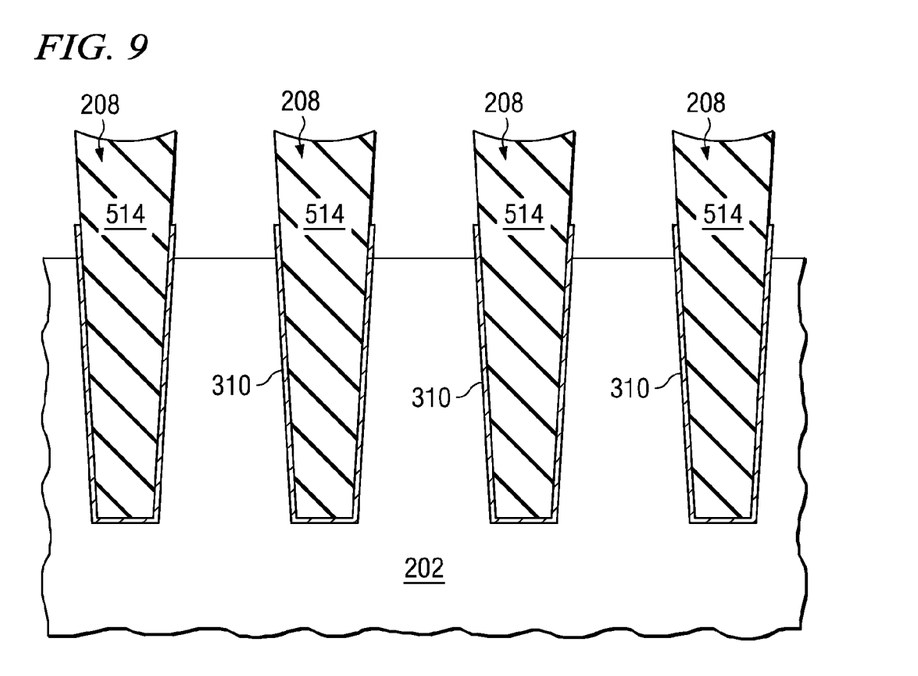
FIG. 9 is a cross sectional view illustrating an exemplary semiconductor device subsequent to removal of the pad oxide layer in accordance with an aspect of the present invention.

FIG. 9 is a cross sectional view illustrating an exemplary semiconductor device subsequent to removal of the pad oxide layer in accordance with an aspect of the present invention. Here, it can also be seen that an upper portion of the shallow trench isolation regions 514 has also been removed, since both materials are oxides in this example.

After removing the pad oxide at block 120, continued fabrication of the device, including active area formation, gate formation, interconnect formation, contact formation, and the like, can be performed. It is appreciated that variations of the method 100 that mitigate clipping and/or damage to an etch stop layer are contemplated and permitted in accordance with the present invention. Furthermore, it is appreciated that the exemplary structures provided in FIGS. 2 to 9 are provided to illustrate the method 100 and that variations of the structures depicted are in accordance with the present invention.

Figure 10:
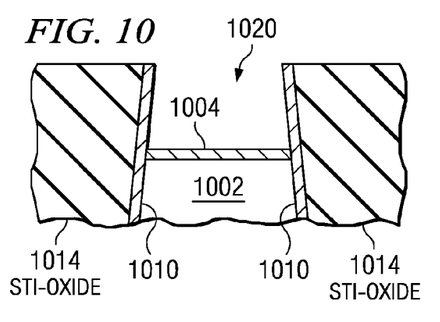
FIG. 10 is a cross sectional view illustrating a portion of a semiconductor device at a stage of fabrication in accordance with an aspect of the present invention.
Figure 11:
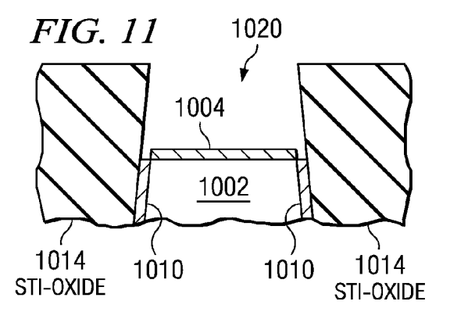
FIG. 11 is a cross sectional view illustrating a portion of a semiconductor device at another stage of fabrication in accordance with an aspect of the present invention.
Figure 12:
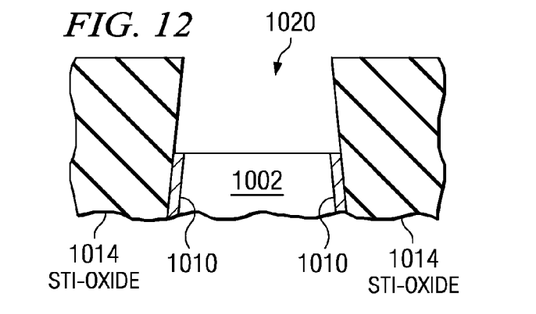
FIG. 12 is a cross sectional view illustrating a portion of a semiconductor device at another stage of fabrication in accordance with an aspect of the present invention.

FIGS. 10, 11, and 12 are provided to further illustrate fabrication of a semiconductor device at various stages of fabrication after removal of an etch stop layer. A protective alloy liner layer is employed in order to protect and mitigate damage to the etch stop layer. Generally, the protective alloy liner layer is resistant to etching by its composition. Partial removal of the protective liner layer is desired in order to avoid "spike" like portions that could interfere with proper operation of the device when an upper portion of trench oxide is subsequently removed from shallow trench isolation regions.

The method 100 of FIG. 1, as well as the FIGS. 2-9, can also be referenced for additional details of components previously described. FIG. 10 is a cross sectional view illustrating a portion of a semiconductor device at a stage of fabrication in accordance with an aspect of the present invention. Shallow trench isolation regions 1014 are shown formed in a semiconductor substrate 1002. The shallow trench isolation regions 1014 are filled with oxide and the semiconductor substrate 1002 is comprised of silicon. A protective alloy liner layer 1010 is shown on sidewalls of the shallow trench isolation region 1014 and includes an exposed portion 1020. A pad oxide layer 1004 is shown formed on the semiconductor substrate 1002.

A number of suitable techniques can be employed to remove the exposed portion 1020 of the protective alloy liner layer 1010. One technique that can be employed to remove the exposed portion of the protective alloy liner layer is a wet, spin etching process. Generally, wet chemicals are provided to a surface of the device while the device itself is spinned thereby causing the exposed portion to be removed. A number of chemicals are coated onto and move across the surface of the wafer on which the device is fabricated, thereby etching the exposed portions. The chemicals flow with a selected direction and velocity. An etch rate of the spin etching process is a function of the flow velocity or speed of the chemicals and rotations per minute of the device or wafer.

When a wafer rotates above a certain amount of rotations per minute (e.g., 2000 rpm), wet chemicals also move rapidly across the wafer as a result of the increased angular velocity. This force causes the chemicals to etch the exposed portions more rapidly than other portions of the device, thereby allowing the exposed portions to be removed without substantially etching other portions of the device.

Another technique that can be employed to remove the exposed portion of the protective alloy liner layer is a plasma assisted wet etch process. Plasma treatment is employed in order to increase the wet etch rate and also to control selectivity of the etch process.

The exposed portion is exposed to a plasma using an inductively-coupled plasma dry etching aperture, for example, thereby giving plasma damage to a surface of the exposed portion. Subsequently, the damaged exposed portion is wet-etched with a dilute hydrogen fluoride solution thereby removing the damaged exposed portion of the protective alloy liner layer.

Yet another technique that can be employed to remove the exposed portion of the protective alloy liner layer is a selective wet etch process. The exposed portion is removed by wet etching with a solution comprising water, a strong acid, an oxidizing agent, and a fluorine compound. The wet etch solution provides selectivity towards the exposed portion and against insulating materials, such as oxide. As a result, the wet etch solution has a high etch rate for the exposed portion and a low etch rate for the trench oxide and the pad oxide 1004 and therefore is operable to remove the exposed portion of the protective alloy liner layer without substantially removing oxide present in the shallow trench isolation regions and the pad oxide 1004.

FIG. 11 is a cross sectional view illustrating a portion of a semiconductor device at another stage of fabrication in accordance with an aspect of the present invention. Here, the exposed portion 1020 has been removed by a suitable technique, such as described above. It can be seen that an upper surface of the protective alloy liner layer 1010 is at about the same level as the semiconductor substrate 1002.

The pad oxide 1004 overlying the substrate 1002 is removed by a suitable etch process, such as a wet etch or dry etch process, thereby exposing the underlying semiconductor substrate 1002. The etch process also removes an upper portion of the shallow trench isolation oxide 1014.

FIG. 12 is a cross sectional view illustrating a portion of a semiconductor device at another stage of fabrication in accordance with an aspect of the present invention. Here, the pad oxide 1004 has been removed as well as the upper portion of the shallow trench isolation regions 1014 by the etch process.

Continued fabrication of the device can be performed including active area formation, interconnect formation, gate formation, and the like.

Figure 13:
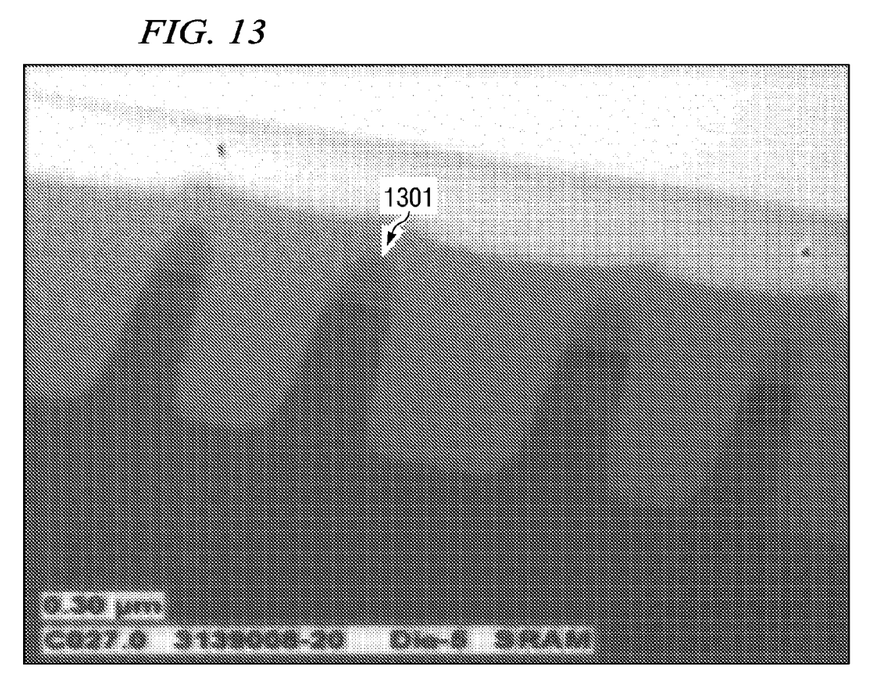
FIG. 13 is a view illustrating clipping caused to an etch stop layer of a conventional device by conventional semiconductor fabrication processes.

FIG. 13 is a TEM view illustrating clipping caused to an etch stop layer of a conventional device by conventional semiconductor fabrication processes. The device is formed without the protective alloy liner layer of the present invention to protect the etch stop layer. As a result, damage/clipping of the etch stop layer occurs. Here, upper corners 1301 of an etch stop layer comprised of nitride have been clipped by a high density plasma trench fill operation. The clipping 1301 degrades the ability of the nitride to operate as an etch stop layer during subsequent planarization.

Figure 14:
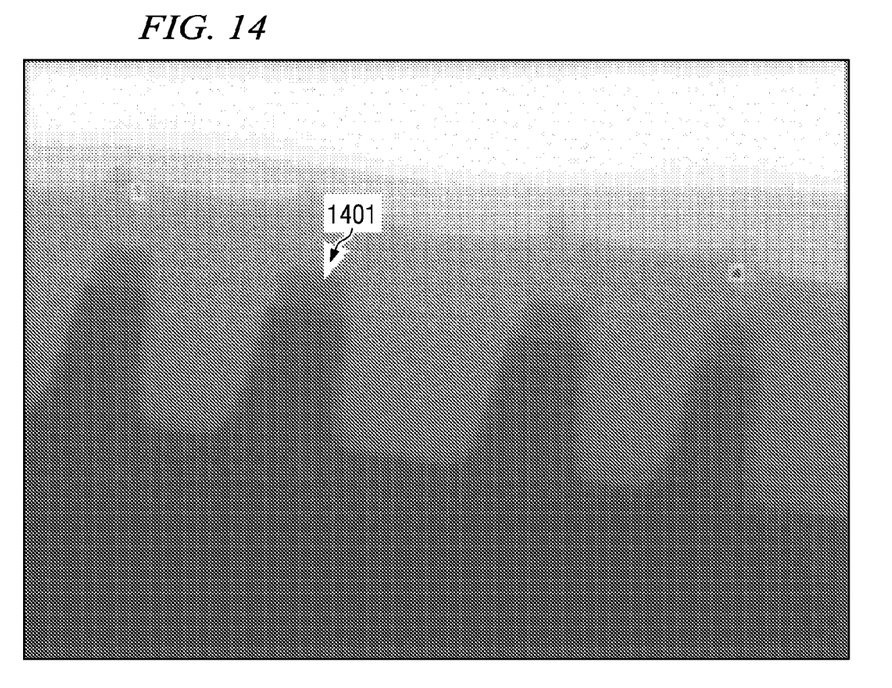
FIG. 14 is a view illustrating reduced clipping of an etch stop layer of a semiconductor device.

FIG. 14 is a view illustrating mitigated clipping of an etch stop layer of a semiconductor device. Clipping of the etch stop layer by, for example, etching and/or trench fill operations has been mitigated. As a result of the reduced clipping, it can be seen in FIG. 14 that corners 1401 of the etch stop layer are not severely clipped. As a result, the operability of the etch stop layer has not been substantially degraded.

Figure 15:
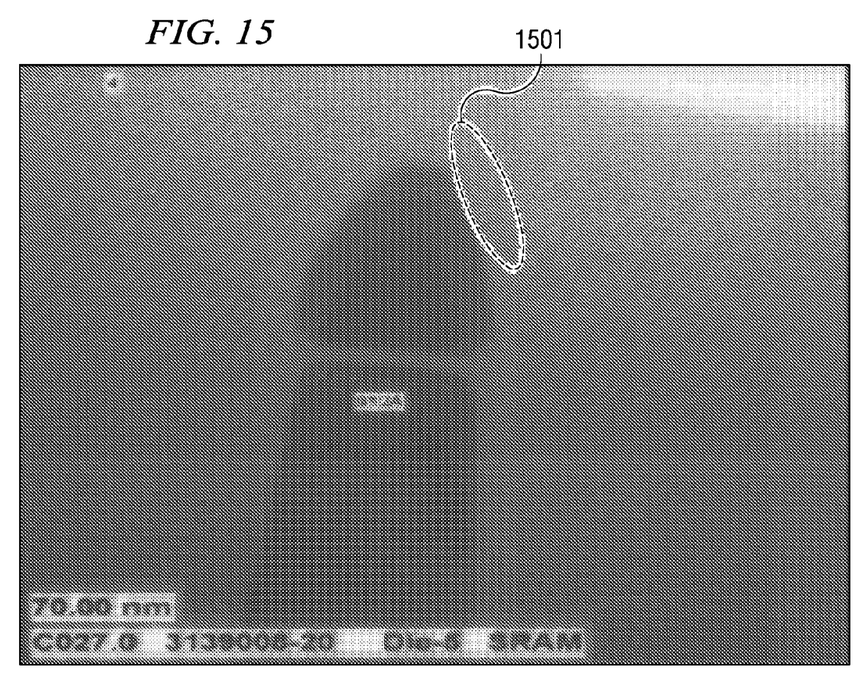
FIG. 15 is a close up view illustrating clipping of an etch stop layer of a conventional device caused by conventional semiconductor fabrication processes.

FIG. 15 is a close up view illustrating clipping of an etch stop layer of a conventional device caused by conventional semiconductor fabrication processes. The device is formed without a protective alloy liner layer to protect the etch stop layer. Upper corners 1501 of the etch stop layer are substantially clipped reducing the effectiveness of the etch stop layer.

Figure 16:
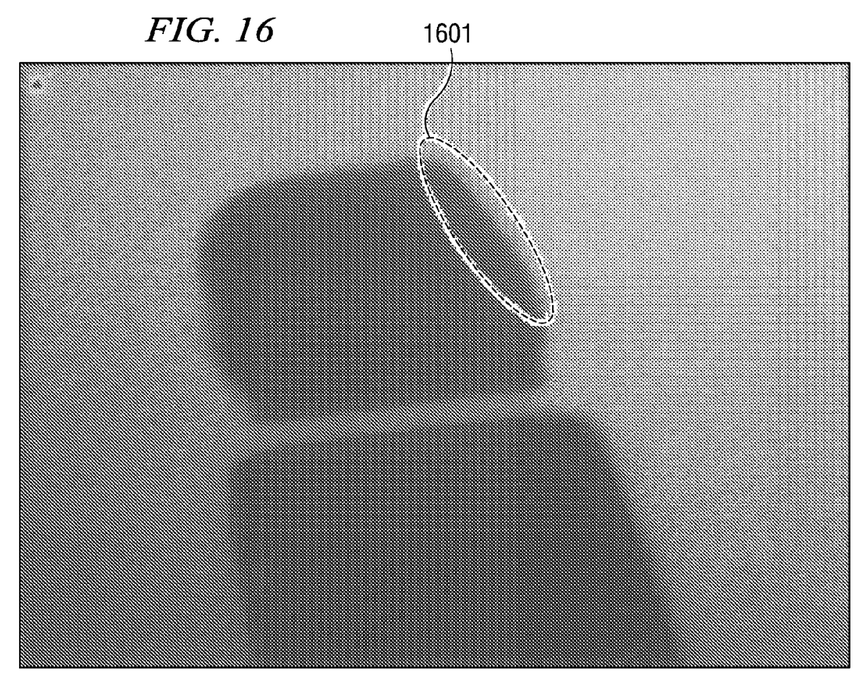
FIG. 16 is a close up view illustrating reduced clipping of an etch stop layer of a semiconductor device.

FIG. 16 is a close up view illustrating a semiconductor device having an etch stop layer with reduced clipping. Clipping of the etch stop layer by, for example, etching and/or trench fill operations has been mitigated for the device of FIG. 16. As a result of the reduced clipping, it can be seen in FIG. 16 that corners 1601 of the etch stop layer are not substantially clipped. The reduced clipping is particularly apparent when compared with the clipped etch stop layer of FIG. 15. As a result, the integrity of the etch stop layer has been maintained and operability of the etch stop layer has not been substantially degraded.

Figure 17:
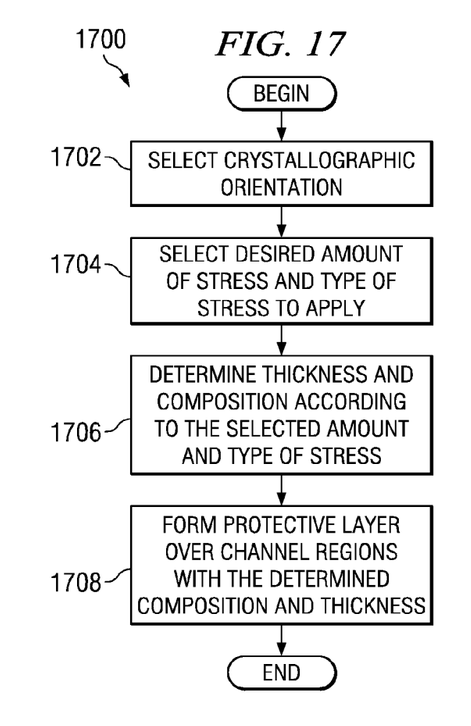
FIG. 17 is a flow diagram illustrating a method 1700 of forming a protective alloy liner layer in accordance with an aspect of the present invention.

FIG. 17 is a flow diagram illustrating a method 1700 of forming a protective alloy liner layer in accordance with an aspect of the present invention. The method selects composition and thickness according to a desired compressive stress and protection and then forms a protective alloy liner layer with the selected composition and thickness.

A number of factors impact channel mobility in transistor devices. Dopant type and concentration are some common factors that impact channel mobility. Other factors include crystallographic orientation and applied stress, whether tensile or compressive. The application of stress to channel regions of semiconductor devices alters channel mobility, sometimes positively and sometimes negatively, depending on the device type and crystallographic orientation. Stress can slightly alter the crystal structure of semiconductor material and thereby improve or degrade channel mobility (electron mobility and/or hole mobility). The inventors of the present invention recognize that varying thicknesses and compositions of the protective alloy liner layer, particularly in regions above an etch stop layer and, therefore, above channel regions, result in varying amounts and types of stresses applied to channel regions of transistor devices formed between adjacent shallow trench isolation regions.

The method 1700 begins at block 1702, wherein a crystallographic orientation (e.g., <1 0 0>, <1 1 1>) is selected. A common crystallographic orientation for silicon based CMOS produces is a <1 0 0> orientation. This means that formed transistor devices have their channel regions lying in the <1 0 0> orientation.

Continuing at block 1704, a desired amount and type of stress is selected. The selected and amount of stress is chosen according to the selected crystallographic orientation, device type (e.g., p-type or n-type), and desired channel mobility adjustments. It is appreciated that some types of applied stress result in improvement in channel mobility for one type of device (n-type) but also result in degradation in channel mobility for another type of device (p-type). However, it still may be desirable to do so if the improvement outweighs the degradation.

Figure 18:
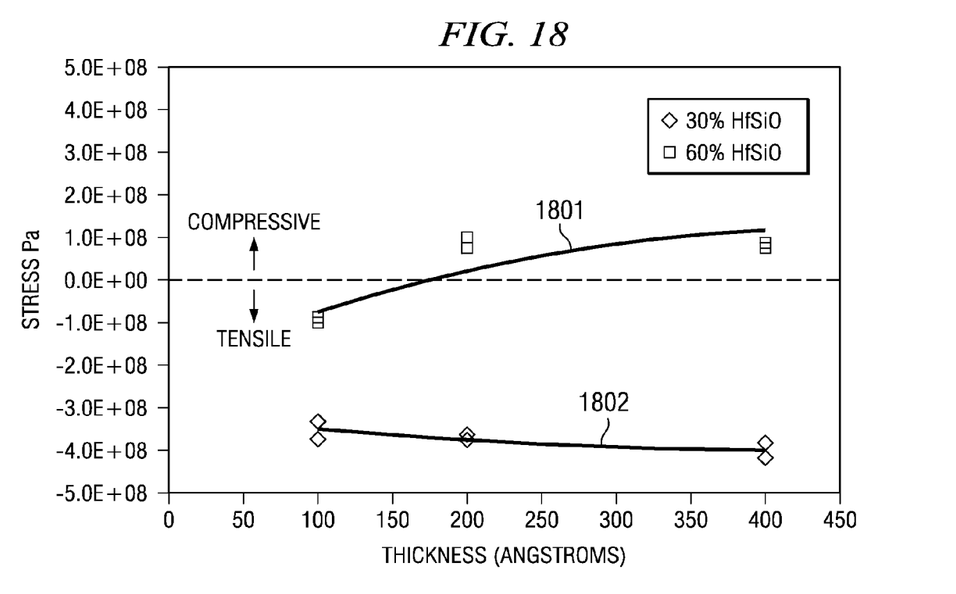
FIG. 18 is a graph illustrating stress generated according to thickness and composition of a protective alloy liner layer in accordance with an aspect of the present invention.

A thickness and a composition are determined at block 1706 according to the desired amount and type of stress selected at block 1704. A relationship between thickness, composition, and generated stress can be determined by expected properties, simulated, or measured and obtained from test data. FIG. 18, described below, illustrates an exemplary relationship between thickness, composition, and generated or resultant stress. Some exemplary suitable thicknesses include about 50 to 450 Angstroms. The composition is obtained from $(AO_2)_x(BO_2)_{1-x}$ wherein A is an element selected from groups III, IV, V, VI, and VII and B is an element selected from groups III, IV, V, and VI. In one example, if A=Hf and B=Si, then a $(HfO_2)_x(SiO_2)_{1-x}$ is formed. As another example, if B=Si, a group IV material that reacts with silicon (e.g., Hf, Zr, La, and the like) can be suitable. Some examples of suitable pseudo binary alloys wherein B=Si include ZrSiO, LaSiO, YSiO, TaSiO, NbSiO, and the like. Some additional examples of suitable pseudo binary alloys include ZrTiO, HfTiO, ZrHfO, ZrGeO, HfGeO, AlTaO, and the like. The value for x is selected and within a range from 0 to 1. It is appreciated that an oxide liner layer can optionally be deposited prior to forming the protective alloy liner layer.

For the composition, the A/B ratio as well as x are selectable variables. Additionally, the thickness and composition can be determined by also considering desired protection of an etch stop layer. Generally, a thicker protective alloy liner layer yields greater protection of the etch stop layer.

Subsequently, the protective alloy liner layer is deposited over the semiconductor device to the selected thickness and with the selected composition, thereby causing the desired amount of stress to be applied at block 1708. The protective alloy liner layer is deposited over channel regions, typically on etch stop layer(s) thereby resulting in the desired stress being applied.

FIG. 18 is a graph illustrating stress generated according to thickness and composition of a protective alloy liner layer in accordance with an aspect of the present invention. In this particular case, A=Hf and B=Si. An x-axis depicts thickness in Angstroms and a y-axis depicts resulting stress in Pascals. A first composition that is HfSiO with 30% $SiO_2$ is represented by a line 1801 and a second composition that is HfSiO with 60% $SiO_2$ is represented by a line 1802. The line 1801 illustrates change in resulting stress according to thickness for the first composition. It can be seen that tensile stress can be obtained by relatively thin layers of the first composition and that compressive stress can be obtained by thicker layers of the first composition. The line 1802 illustrates change in resulting stress according to thickness for the second composition. Here, only tensile stress can be obtained. However, the amount of stress obtained by the second composition is substantially greater than the amount of stress obtained by the first composition. It is appreciated that similar graphs and relationships can be obtained for other compositions and thicknesses to provide selected amounts of compression by protective alloy liner layers in accordance with the present invention.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method comprising:
    selecting a crystallographic orientation for formation of transistor devices;
    selecting a desired amount and type of stress to be applied according to the crystallographic orientation and type(s) of the transistor devices; and
    determining a thickness and composition for a protective alloy liner layer according to the desired amount of stress and the desired type of stress.

2. The method of claim 1, wherein determining the thickness and composition for the protective alloy liner layer is further according to desired protection of an etch stop layer during a trench fill operation.

3. The method of claim 1, further comprising forming the protective alloy liner layer on upper surfaces of an etch stop layer and on a bottom and sidewalls of trench regions of a semiconductor device according to the selected thickness and the selected composition causing the desired stress to be applied across prospective channel regions of the transistor devices.

4. The method of claim 1, wherein the crystallographic orientation is <1 0 0>.

5. The method of claim 1, wherein the desired stress type is compressive.

6. The method of claim 1, wherein the desired stress type is tensile.

7. The method of claim 1, wherein the types of transistor devices include n-type.

* * * * *